(12) United States Patent
Jang et al.

(10) Patent No.: US 8,452,441 B2
(45) Date of Patent: May 28, 2013

(54) PROCESS QUALITY PREDICTING SYSTEM AND METHOD THEREOF

(75) Inventors: Shi-Shang Jang, Hsinchu (TW);
Tain-Hong Pan, Jiangsu (CN);
Shan-Hill Wong, Hsinchu (TW)

(73) Assignee: National Tsing Hua University, Hsin-Chu (TW)

( * ) Notice: Subject to any disclaimer, the term of this patent is extended or adjusted under 35 U.S.C. 154(b) by 367 days.

(21) Appl. No.: 12/853,497

(22) Filed: Aug. 10, 2010

(65) Prior Publication Data

US 2011/0282480 A1 Nov. 17, 2011

(30) Foreign Application Priority Data

May 17, 2010 (TW) .............................. 99115738 A

(51) Int. Cl.
*G06F 19/00* (2011.01)
*G06F 7/60* (2006.01)
*G06F 17/50* (2006.01)
*G05B 19/418* (2006.01)

(52) U.S. Cl.
CPC ...... *G05B 19/41875* (2013.01); *G06F 17/5018* (2013.01); *G06F 17/5022* (2013.01)
USPC ................... 700/121; 700/110; 703/2; 703/14

(58) Field of Classification Search
None
See application file for complete search history.

(56) References Cited

U.S. PATENT DOCUMENTS

| 6,616,759 | B2 | 9/2003 | Tanaka et al. | |
|---|---|---|---|---|
| 6,666,577 | B2 | 12/2003 | Shibata et al. | |
| 6,829,056 | B1 * | 12/2004 | Barnes et al. | 356/625 |
| 7,634,325 | B2 * | 12/2009 | Wang et al. | 700/121 |
| 2006/0036345 | A1 * | 2/2006 | Cao et al. | 700/108 |
| 2008/0275588 | A1 * | 11/2008 | Wang et al. | 700/121 |
| 2010/0138026 | A1 * | 6/2010 | Kaushal et al. | 700/104 |

FOREIGN PATENT DOCUMENTS

| TW | 093115993 | 6/2004 |
|---|---|---|
| TW | 094121585 | 6/2005 |
| TW | 095120601 | 6/2006 |

OTHER PUBLICATIONS

Kiehlbaugh, K.M., "Halogen-Based Plasma Etching of Novel Field-Effect Transistor Gate Materials", Fall 2009, Doctor of Philosophy dissertation, Graduate Division, University of California, Berkeley.*

Beghi, A and Susto, G.A., "Virtual Metrology for Semiconductor Manufacturing Applications", Mar. 26, 2010, Department of Chemical Engineering Principles and Practice (DIPIC), University of Padua (Italy).*

(Continued)

*Primary Examiner* — Mohammad Ali
*Assistant Examiner* — Kelvin Booker
(74) *Attorney, Agent, or Firm* — WPAT, P.C.; Anthony King

(57) ABSTRACT

The invention discloses a process quality prediction system and a method thereof. When a processing apparatus performs a process on a target, the process is measured by a measurement apparatus to receive a process value. The process value and several previous quality data collected from the measurement apparatus are used to predict the quality of the product which is processing inline. The method is composed of a moving window, a stepwise regression scheme and an analysis of covariance (ANCOVA). The drift and shift of process are overcome by the moving window. A key variable set is selected by the stepwise regression scheme and a virtual model is identified by the analysis of covariance.

8 Claims, 11 Drawing Sheets

OTHER PUBLICATIONS

Nash, L.J., "Characterisation of Terrace Graded Virtual Substrates with Si(1-x)Ge(x) 0.15<=x<=1", Sep. 2005, Doctor of Philosophy thesis, University of Warwick, Department of Physics.*

Chang, Y.-J.; Kang, Y.; Hsu, C.-L.; Chang, C.-T.; and Chan, T.Y., "Virtual Metrology Technique for Semiconductor Manufacturing", Jul. 2006, 2006 International Joint Conference on Neural Networks, Sheraton Vancouver Wall Centre Hotel, Vancouver, BC, Canada.*

Hung, M.-H.; Lin, T.-H.; Cheng, F.-T. and Lin, R.-C., "A Novel Virtual Metrology Scheme for Predicting CVD Thickness in Semiconductor Manufacturing", Jun. 2007, IEEE/ASME Transactions on Mechatronics, vol. 12, No. 3.*

Khan, A.A.; Moyne, J.R. and Tilbury, D.M., "An Approach for Factory-Wide Control Utilizing Virtual Metrology", Nov. 2007, IEEE Transactions on Semiconductor Manufacturing, vol. 20, No. 4.*

Yung-Cheng, J. C. and Cheng, F.-T., "Application Development of Virtual Metrology in Semiconductor Industry", Nov. 2005, $31^{st}$ Annual Conference of IEEE Industrial Electronics Society-IECON 2005.*

* cited by examiner

PROCESS QUALITY PREDICTING SYSTEM AND METHOD THEREOF

FIELD OF THE INVENTION

The present invention relates to a process quality prediction system and a method thereof, and more particularly to a system for predicting current process quality using previous quality data, and a method thereof.

BACKGROUND OF THE INVENTION

Based on the consideration of manufacturing costs, a random sampling method is commonly used at present for inspecting the product quality of a production machine inmost semiconductor manufacturing processes. Two to three pieces of wafers are selected from each process batch (each bath contains 25 pieces of wafers) for the actual measurements, thereby monitoring whether or not the quality of the manufacturing process is stable, and consequently the quality of the products is determined. Therefore, if there is any problem in the manufacturing process for a certain process batch, the problem will not be found until the inspection is completed. As a result, the manufacturing process may have continued manufacturing several defectives products already. Therefore, there is a time difference between the occurrence of a variation of the operating variables of the manufacturing process and the occurrence of a defective product. Thus, it is an important subject for the semiconductor manufacturers to predict the quality issue of a product within the shortest time duration.

Virtual metrology is a major technical measure for solving the aforementioned problem, and whose basic concept uses a large number of predicting variables for an online measurement. For example, the techniques of fault detection and data classification are used for estimating the production quality of the product, such that any abnormality occurred at the production machines can be discovered timely. While the defective products can be determined and detected, the energy sources and resources for the later coming processes can be saved, and the production yield can be improved. However, a huge number of data may be involved in fault detection and data classification, and a high correlation exists between certain variables. Consequently, the conventional processing method adopts the statistical regression method, and the principal component regression (PCR) and partial least squares (PLS) are used extensively. Both PCR and PLS can project high-dimensional and collinear data to a space defined by orthogonal major factors or potential variables, such that newly obtained variables are independent of each other. In addition, certain unknown interfering factors always affect the manufacturing process. Both PCR and PLS those are generally in a stable status are not applicable for the semiconductor manufacturing process.

In addition, for the PCR and PLS, data are usually compressed to replace the original variables, and at-site engineers are unable to understand the influence of each variable on the product quality immediately, or find out the key factors of the abnormality.

In currently known patent applications, for example, "Quality prediction system for a production process and method thereof" as disclosed in R.O.C. Pat. Application No. 093115993 is applied in the semiconductor manufacturing industry, wherein the properties of a machine are used to select a corresponding estimation model and predict the quality of a future manufacturing product. But, such method limits the machine from having any maintenance and adjustments, and fails to point out the key variables for a certain batch product produced in the manufacturing process.

A "virtual metrology for quality control applied for a semiconductor manufacture" as disclosed in R.O.C. Pat. Application No. 095120601 is applied in the semiconductor manufacturing industry, wherein the sampling frequency of wafers is set, and the difference between the actual measured value and the estimated value is used for correcting a control chart to determine the next action taken. This method reflects the variation of the machine, but it cannot reflect the source causing the variation of the machine. Furthermore, the misjudgment rate is relatively high if there is any interference.

An "Instant predicting and measuring system, manufacturing information integrated in instant predicting system, and method of predicting at least one output in a virtual measuring tool" as disclosed R.O.C. Pat. Application No. 094121585 is applied in the semiconductor manufacturing industry, wherein an instant predicting and measuring architecture is provided. This method requires at least one output variation for each information system related to the manufacturing process, and suitable related variables cannot be used according to the characteristics of the equipments.

A "Method of monitoring and/or controlling a semiconductor manufacturing apparatus and a system" as disclosed in U.S. Pat. No. 6,616,759 is applied for semiconducting manufacturing processes, wherein a method is based on the PLS method and used for calculating new parameter values of the manufacturing process, but this method does not allow engineers to know about the influence of each variable on the product quality.

A method of predicting a wafer manufacturing temperature as disclosed in U.S. Pat. No. 6,666,577 entitled "Method for predicting temperature, test wafer for use in temperature prediction and method for evaluating lamp heating system" is applicable for a certain specific types of machines only, and lack of universality.

In summary, the aforementioned R.O.C. and U.S. patents or patent applications just taught the method of how to predict the machines, but the precision of the prediction is not high and the prediction may be affected by other factors easily. Furthermore, the key parameters of the manufacturing result of the finished goods in the manufacturing process cannot be found. In the present semiconductor manufacturing process, a method capable of predicting and analyzing key factors of a manufacturing process is absolutely necessary.

SUMMARY OF THE INVENTION

In view of the above-mentioned problems of the prior art, an object of the present invention is to provide a process quality prediction system and a method thereof, which incorporate a fault detection and classification system, substitute variable selection for variable compression to find the key variables that affect the process, use a moving window to overcome the drift and shift of the system, and provide a virtual measuring tool to predict the performance of the process and improve the yield of products.

According to the object of the present invention, there is provided a process quality prediction system comprising a processing apparatus, a measurement apparatus, a fault detection and classification unit, a data collection unit and a virtual metrology automation unit. The processing apparatus performs a process on at least one batch product. The measurement apparatus samples and inspects the at least one batch product to obtain an actual measured value of the batch product. The fault detection and classification unit is electrically connected to the processing apparatus for recording the process to obtain a process value. The data collection unit is connected to the fault detection and classification unit for obtaining the process value via the fault detection and classification unit and obtaining the actual measured value of the batch product from the measurement apparatus. The virtual metrology automation unit establishes a virtual metrology model based on the process value and the actual measured value of the batch product, and predicts the quality predictive value of the product being processed inline according to the virtual model in real-time.

The batch product may be a wafer or a substrate.

The virtual metrology automation unit filters out the process-independent data from the process value and the actual measured value of the batch product to fetch a process characteristic value set.

The virtual metrology automation unit uses the process characteristic value set to update a moving window module and thus obtain a key variable set affecting the process.

The virtual metrology automation unit uses an analysis of covariance to analyze the key variable set and thus obtain the virtual model.

The virtual metrology automation unit uses the process characteristic value set to update a moving window module and thus obtain a key variable set affecting the process.

The moving window module is used for showing all the data of the at least one batch product in the process during a recent period of time.

A stepwise regression scheme is selectively used to obtain variables affecting the process from the key variable set.

According to an object of the present invention, there is further provided a process quality prediction method comprising the steps of: performing a process on at least one batch product in a processing apparatus, sampling and inspecting the at least one batch product by a measurement apparatus, obtaining a process value through a fault detection and classification unit by a data collection unit and obtaining an actual measured value of the batch product by the fault detection and classification unit, obtaining a virtual model from the process value and the actual measured value of the batch product by a virtual metrology automation unit, and predicting the quality predictive value of the product being processed inline according to the virtual model in real-time.

As described above, the process quality prediction system and the method thereof according to the present invention may have one or more of the following advantages:

(1) The process quality prediction system can update the prediction basis based on the current process data, whereby the operation of the processing apparatus can be improved to reduce the waste of energy and materials in the process.

(2) The process quality prediction method uses real-time analysis to provide an improved process, which is applicable to various semiconductor manufacturing processes.

(3) According to the process quality prediction method, system disturbances are captured via the moving window in real-time to increase the precision of the prediction.

(4) The process quality prediction method can provide for field engineers' reference by the selection of key variables, so as to improve the process.

DETAILED DESCRIPTION OF THE PREFERRED EMBODIMENTS

Figure 1:
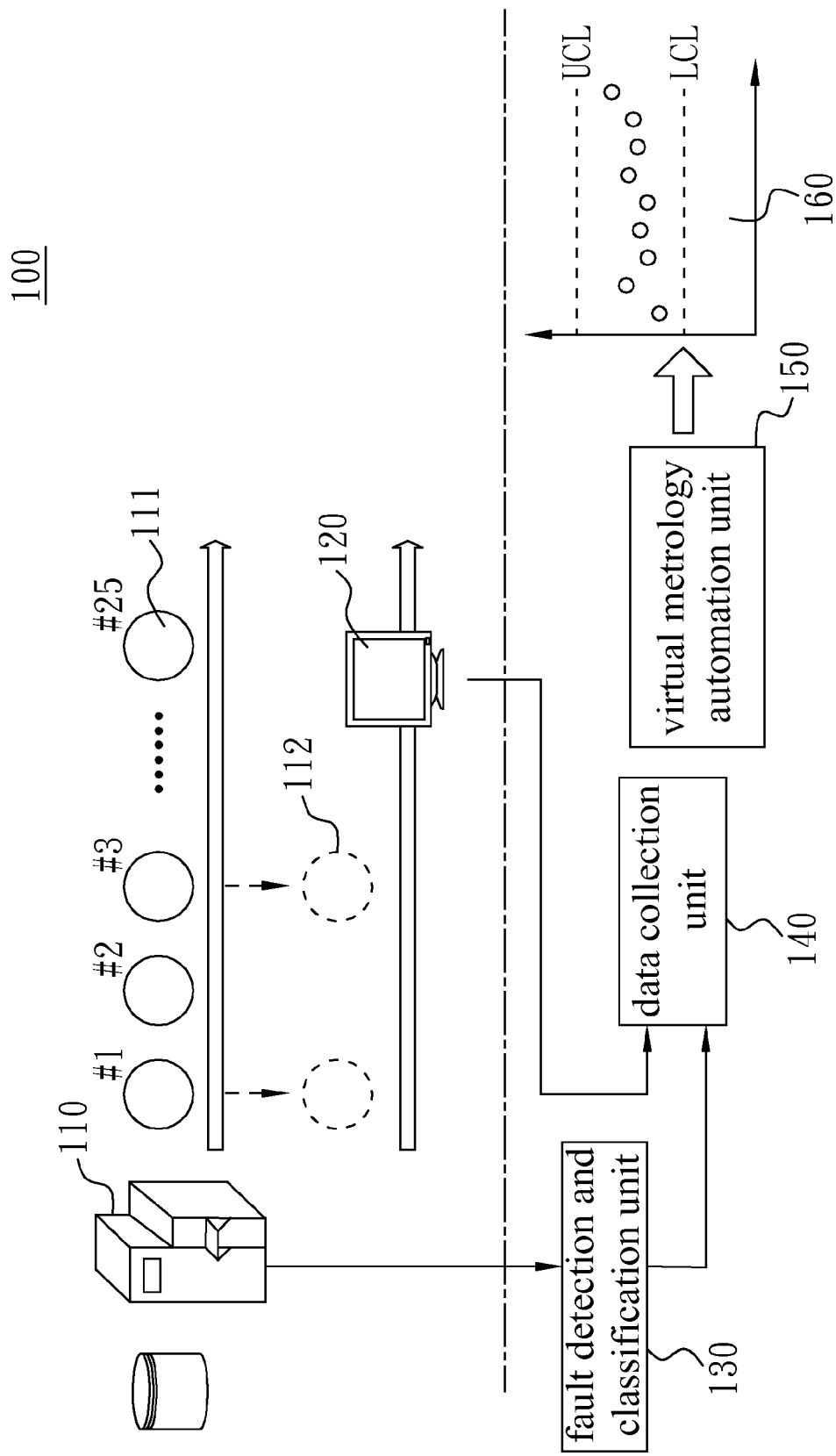
FIG. 1 is a schematic view of a process quality prediction system according to the present invention.

Referring to FIG. 1, there is shown a schematic view of a process quality prediction system according to the present invention. In this figure, the process quality prediction system 100 comprises a processing apparatus 110, a measurement apparatus 120, a fault detection and classification unit 130, a data collection unit 140 and a virtual metrology automation unit 150. The processing apparatus 100 performs a process on at least one batch product 111. The measurement apparatus 120 samples the batch product 111 to perform a sampling inspection. The fault detection and classification unit 130 is electrically connected to the processing apparatus 110 and provided for recording the process action to obtain a process value. The data collection unit 140 is connected to the fault detection and classification unit 130, and provided for obtaining a process value by the fault detection and classification unit 130. The actual measured value of the batch product is obtained by the measurement apparatus 120. The virtual metrology automation unit 150 establishes a virtual model of the virtual metrology according on the process value and the actual measured value of the batch product, and establishes a virtual model related to the virtual metrology, and the virtual model. After the predictive value 160 of a batch product in the current process action is detected, the quality predictive value 160 of the batch product is fed back to the process quality prediction system 100 to carry out a following processing or suspend an action of the processing apparatus 110 according to the quality predictive value 160 of the batch product in order to carry out the following maintenance procedures.

However, the prior processing apparatus 110 will be aged with time and its precision will be lost, or the processing apparatus 110 will lose its precision due to the problem of the processing apparatus 110 or caused by different operators. The virtual metrology automation unit 150 may result in a failure or an inaccurate prediction due to the aforementioned problems, and thus the present invention provides a novel architecture of a virtual metrology automation unit to avoid the aforementioned problems.

Figure 2:
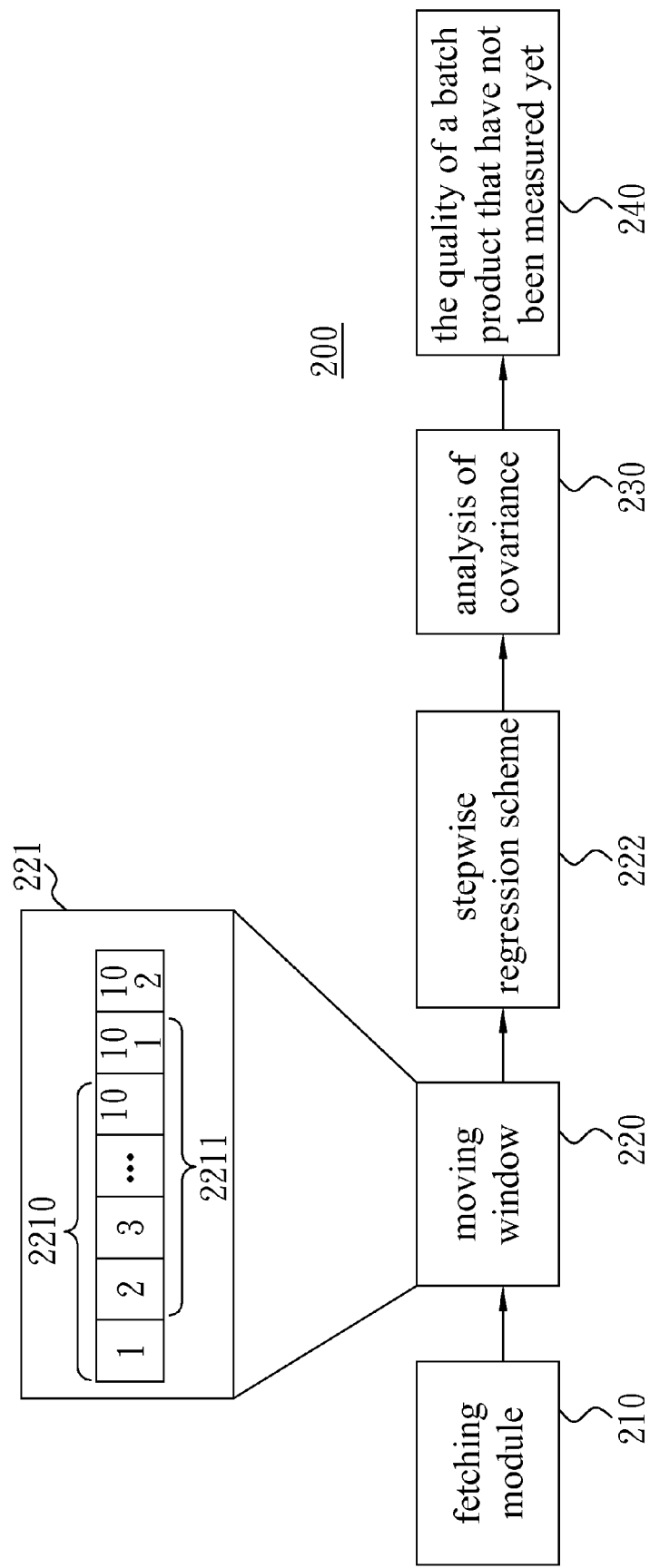
FIG. 2 is a schematic view showing an architecture of a virtual metrology automation unit according to the present invention.

Referring to FIG. 2, there is shown a schematic view of an architecture of a virtual metrology automation unit according to the present invention. When the batch product is manufactured by the processing apparatus, the measurement apparatus is used for collecting samples. After the batch product has gone through the manufacturing process, the fault detection and classification system and the measuring system will transmit the process value and the actual measured value of the batch product to a fetching module 210. The fetching module 210 fetches a process characteristic value set from the process value and the actual measured value of the batch product, and the process characteristic value set is updated by rolling a moving window 220 backward to reference and use the process characteristic value set. For example, a first window 2210 is moved backward and used as a second window 2211, and then a stepwise regression scheme 222 is used to obtain a key variable set that affects a process action. An analysis of covariance (ANCOVA) 230 is used for obtaining a virtual model, and the virtual model can be used for obtaining the quality 240 of a batch product that have not been measured yet.

The virtual metrology of the present invention can replace traditional measuring systems. If the process value and the actual measured value of the batch product are inputted into the virtual metrology automation unit, a virtual model will be created, and the virtual model includes:

$$\Omega = \{\chi_1, \chi_2, \ldots, \chi_n\}$$

where, $\Omega$ is a key variable space selected by a stepwise regression scheme 222, and $\chi_i$ is a process value of a fault detection and classification system.

$$y = \sum_{k=1}^{m} \tau_k + \sum_{i=1}^{n} a_i x_i + \varepsilon$$

where, $\tau_k$ is the performance of all processing apparatuses in a manufacturing process.

Figure 3:
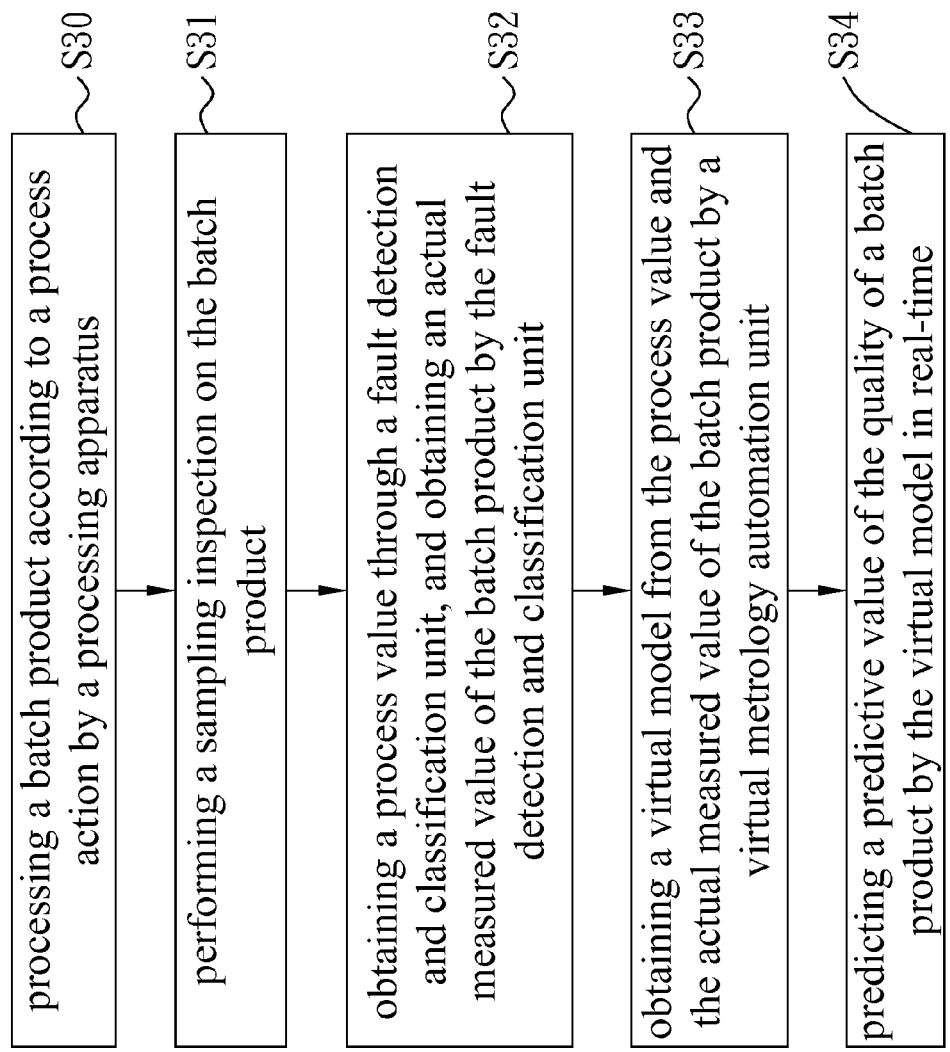
FIG. 3 is a flow chart of a process quality prediction method according to the present invention.

Referring to FIG. 3, there is shown a flow chart of a process quality prediction method of the present invention, the method comprises the steps of:

(S30) processing at least one batch product according to a process action by a processing apparatus;

(S31) performing a sampling inspection on at least one batch product by a measurement apparatus;

(S32) obtaining a process value through a fault detection and classification unit by a data collection unit, and obtaining an actual measured value of the batch product by the fault detection and classification unit;

(S33) obtaining a virtual model from the process value and the actual measured value of the batch product by a virtual metrology automation unit; and (S34) predicting a predictive value of the quality of a batch product by the virtual model in real-time.

Figure 4:
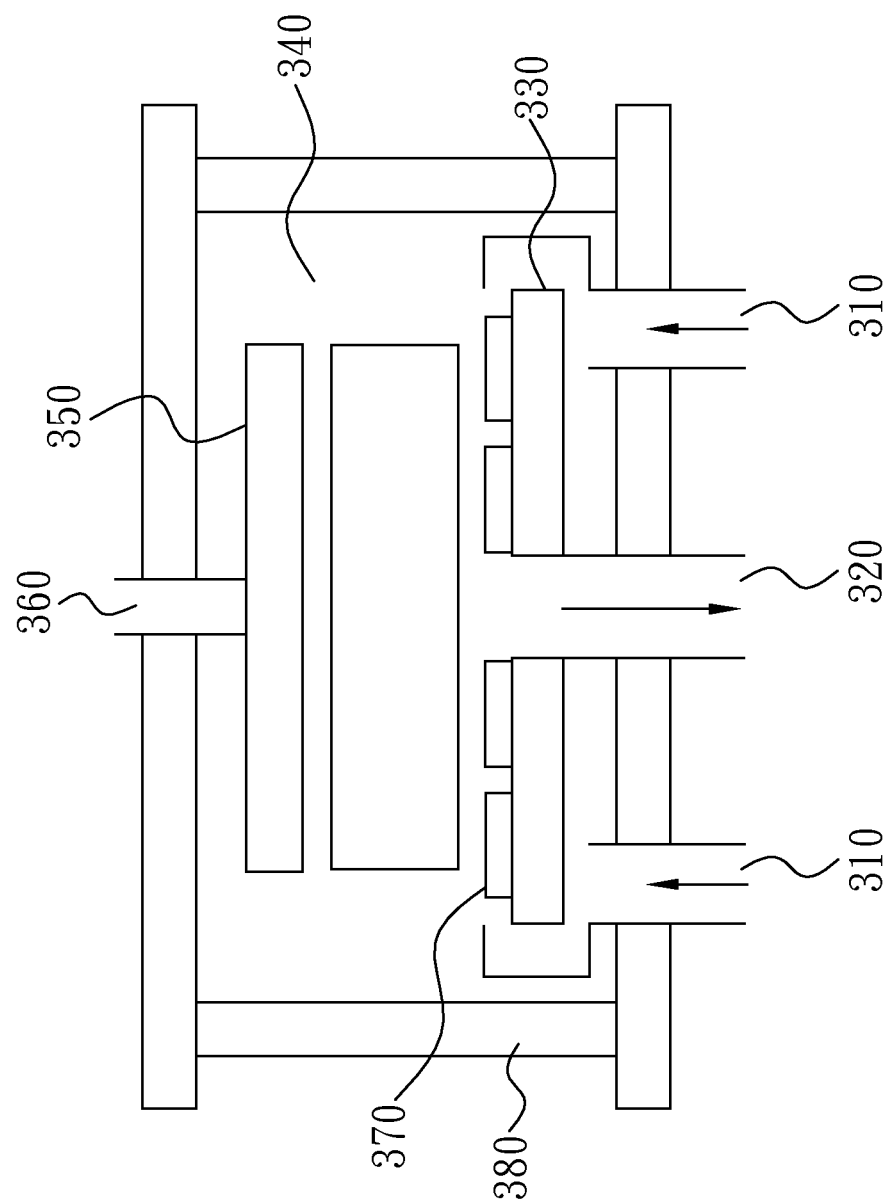
FIG. 4 is a structural diagram of a process quality prediction method according to a preferred embodiment of the present invention.

Referring to FIG. 4, there is shown a structural diagram of a process quality prediction method according to a preferred embodiment of the present invention, a structural diagram of a plasma enhanced chemical vapor deposition (PECVD) used in a semiconductor fabrication plant is shown, wherein a deposition chamber 340 is comprised of upper and lower aluminum plates, respectively the upper aluminum plate 350 and the lower aluminum plate 330, and an aluminum or glass partition wall 380. A chip 370 is placed on the lower aluminum plate 330, and both upper and lower aluminum plates 350, 330 are heated to a temperature ranging from 100 to 400 by a resistance coil or a bulb. If a radio frequency (RF) voltage 360 is applied between the upper and lower aluminum plates 350, 330, the two aluminum plates 330, 350 will produce an airglow emission, and air is introduced from an air inlet 310 to perform a radial flow and passed through the airglow emission area, and finally discharged from the middle position by a vacuum pump 320.

Figure 5:
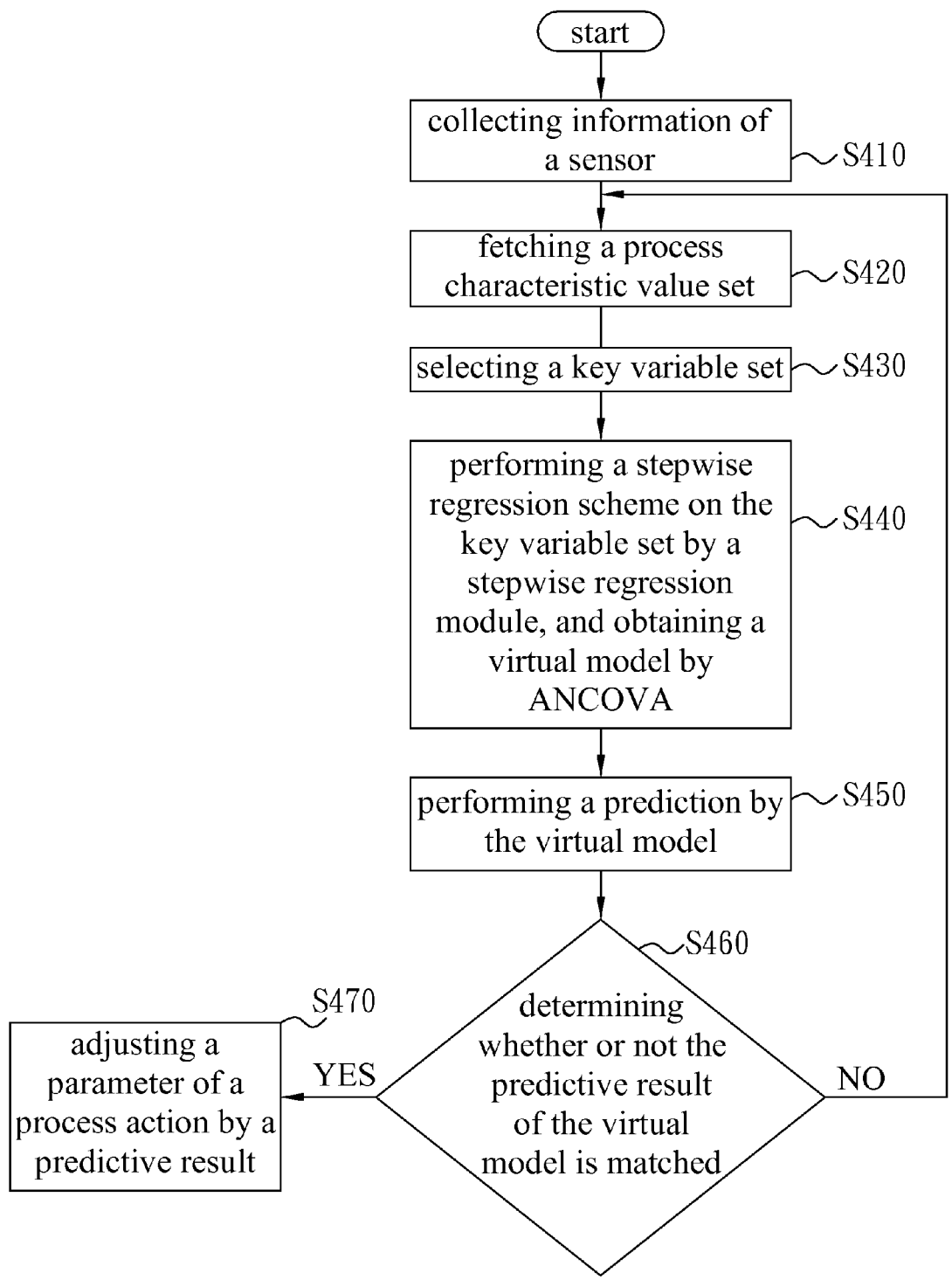
FIG. 5 is a schematic view of a quality prediction flow of a process quality prediction method according to a preferred embodiment of the present invention.

Referring to FIG. 5, there is shown a schematic view of a quality prediction flow of a process quality prediction method according to a preferred embodiment of the present invention, the method comprises the steps of:

(S410) collecting information of a sensor in a process;

(S420) selectively fetching a process characteristic value set in a process value;

(S430) selecting a key variable set in the process characteristic value set;

(S440) performing a stepwise regression scheme on the key variable set by a stepwise regression module, and obtaining a virtual model by ANCOVA;

(S450) performing a prediction by the virtual model;

(S460) determining whether or not the predictive result of the virtual model is matched; and (S470) adjusting a parameter of a process action by a predictive result.

The predictive quality ($\hat{y}_{i+j}$) of the batch product can be predicted by the measured values ($y_{i-1}, y_{i-2}, \ldots, y_{i-n}$) of the quality of the past process batches of products provided by a measuring machine and the process value of a process action currently taken place at a manufacturing machine.

Firstly, Step S410 is carried out to collect the information of a sensor. The deposition process action includes a total of 21 manufacturing steps, and each stage of the manufacturing process includes 59 detecting magnitudes, which are 59 variables. There will be a total of 1239 variable in the deposition process if all variables is are summed up. It is learned from factories that there are ten manufacturing stages (2, 4, 5, 7, 10, 13, 15, 19, 23, 24) having a significant effect on the deposition thickness, wherein the tenth manufacturing stage and the nineteenth manufacturing stage are main steps respectively the deposition and sputter, and the rest of the manufacturing stages are used for stabilizing the manufacturing stages. To meet the required temperature, pressure, flow or constant pressure and constant temperature for the necessary manufacturing stages, a constant or a single variable is deleted, and finally there are 319 input variables remained.

Figure 6:
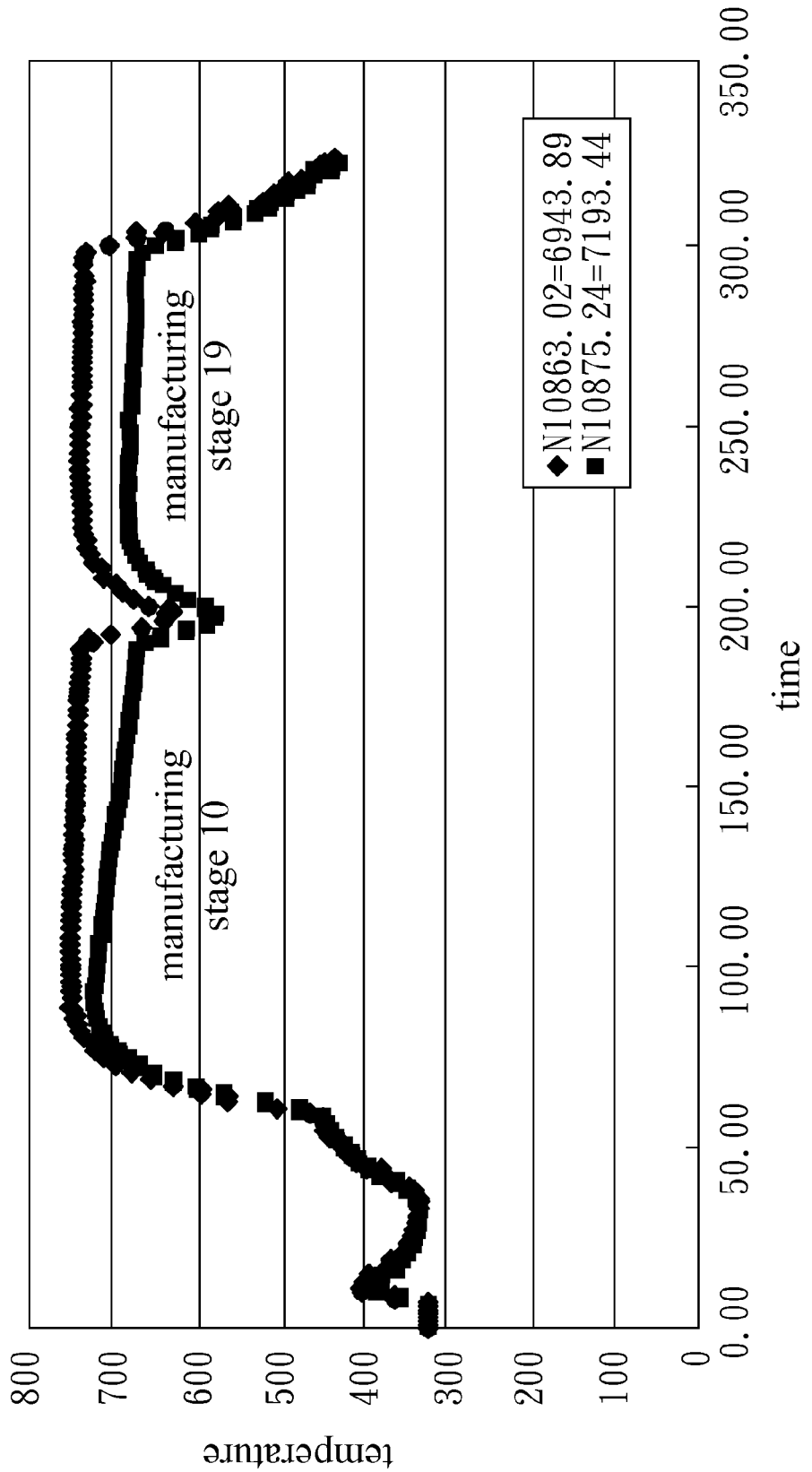
FIG. 6 is a chart showing the variation in process values according to a preferred embodiment of the present invention.

Secondly, Step S420 is carried out to select a characteristic value set of each process value. With reference to FIG. 6 for a chart showing the variation in process values according to a preferred embodiment of the present invention, the change of process values occurred in a wafer fabrication is shown. It may be found that the temperature of the wafer has a relatively large variation with regard to time, and such variation is more significant in the tenth and nineteenth manufacturing stages. Therefore, only the tenth and nineteenth manufacturing stages are taken into consideration in the process characteristic value set.

Figure 7:
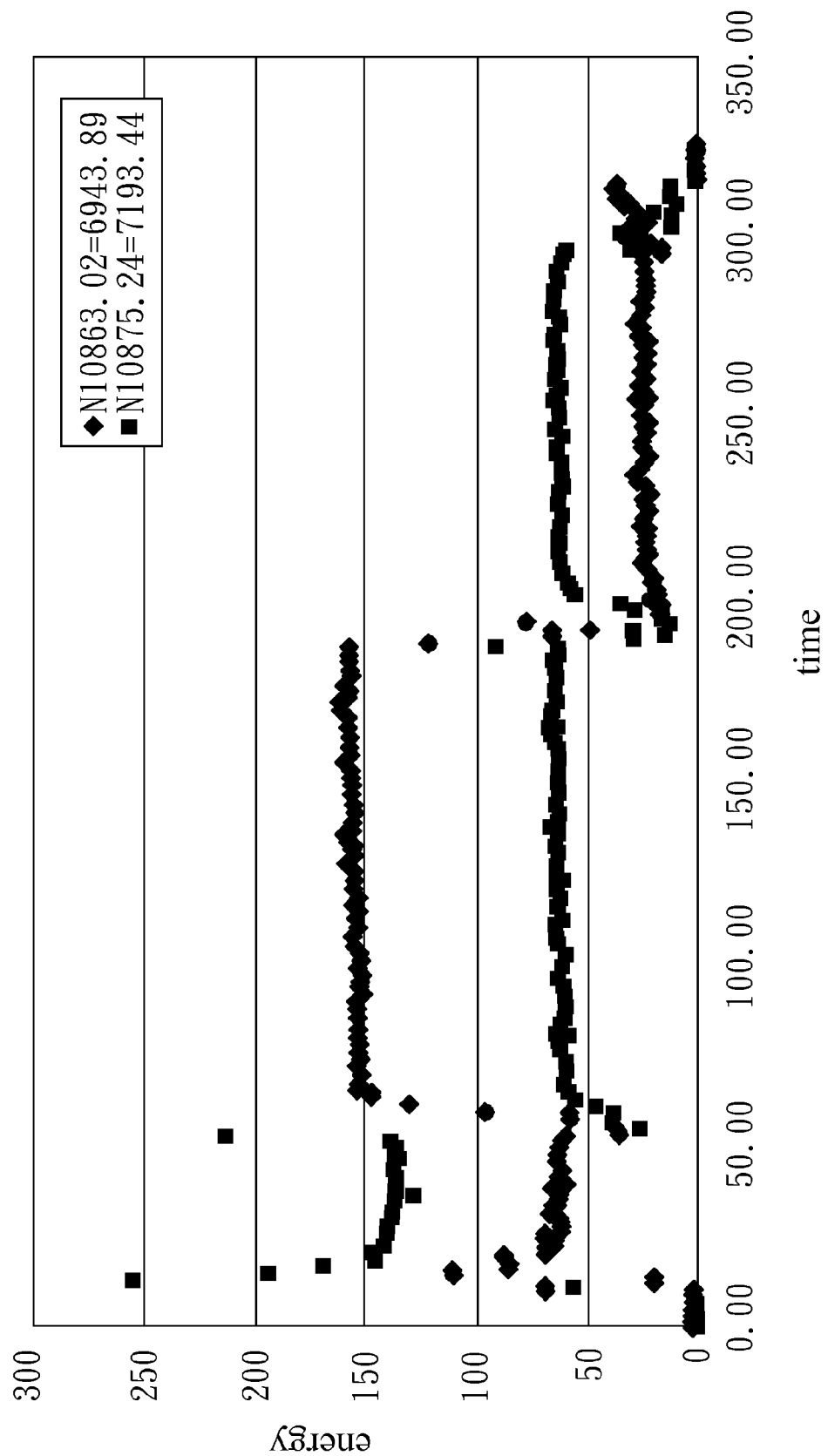
FIG. 7 is a schematic view of reflected energy at a radio frequency terminal of a process quality prediction method according to a preferred embodiment of the present invention.

Referring to FIG. 7, there is shown a schematic view of a reflected energy at a radio frequency terminal of a process quality prediction method according to a preferred embodiment of the present invention, even though the reflected energy at the radio frequency terminal has effects on the reactive variables, yet the variation of energy at each manufacturing stage versus time is constant, and thus there is no need to obtain such process characteristic value set.

In FIG. 5, Step S430 is carried out to select a key variable to be used for establishing a virtual model. With a pre-processing of information, the 319 input variables are obtained. It is very difficult to check whether or not the variables affect the thickness one by one. Even if it is feasible, we can only observe the effect of a single variable on the thickness, but we cannot concurrently observe the interaction between variables. Therefore a stepwise regression scheme is adopted to add or delete the variables one by one to observe if a good interpretation of the whole model can be achieved, so as to determine which variable should be deleted or kept. To avoid fetching too many variables, the maximum number of variables is set to be 10 by a program, such that the program will be terminated to determine other variables if the maximum number of variables is reached.

Step S440 is carried out, and the stepwise regression scheme is used to select variables as the input variables, and the finally formed thickness becomes the output variable, and then ANCOVA is used for establishing a virtual model, and 100 records of data are used for creating the model each time. A record of old data will be deleted if a record of new data is entered, and then another new virtual model is established again, and so on.

Step S450 is carried out to perform a quality prediction by virtual model. If the required precision is not satisfied, another round of processes is carried out, or else the model is accepted as the final model.

Figure 8:
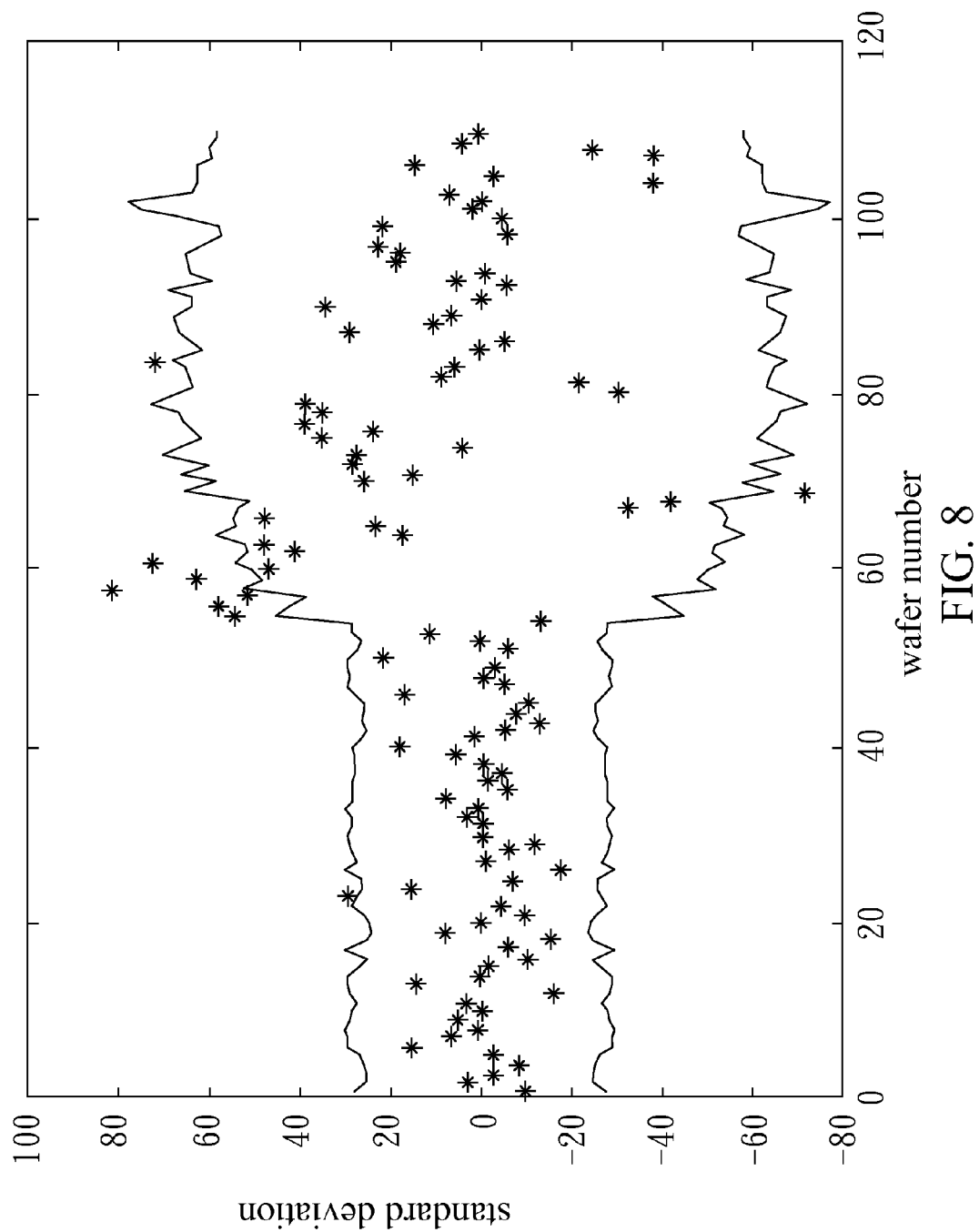
FIG. 8 is an analytical chart of a virtual model of a process quality prediction method according to a preferred embodiment of the present invention.
Figure 9:
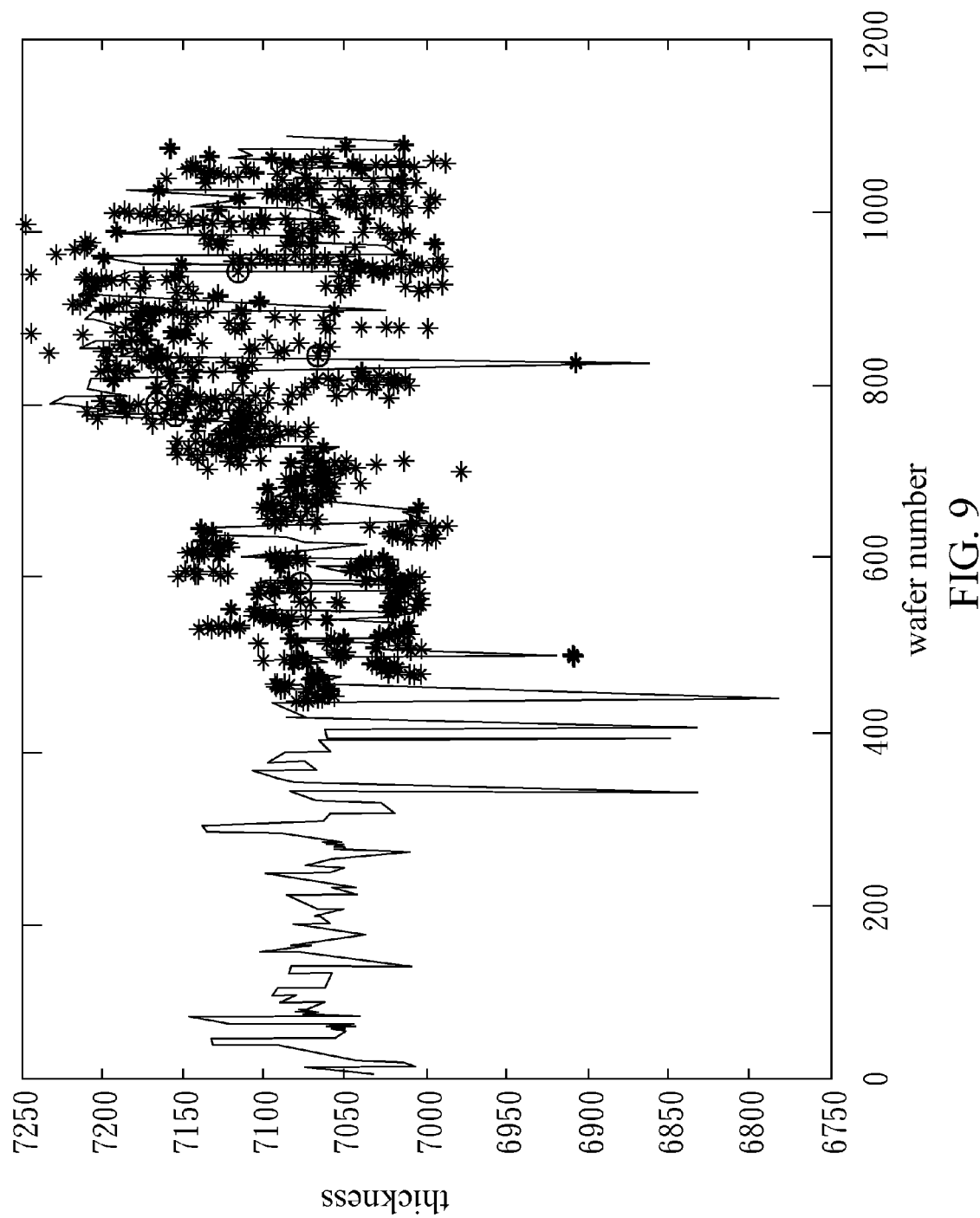
FIG. 9 is a comparison diagram of an actual measured value and a virtual model of a process quality prediction method according to a preferred embodiment of the present invention.

Referring to FIGS. 8 and 9, there are shown an analytical chart of a virtual model of a process quality prediction method according to a preferred embodiment of the present invention and a comparison diagram of an actual measured value and a virtual model of a process quality prediction method according to a preferred embodiment of the present invention. The solid line in FIG. 8 shows the 3-times standard deviation calculated by the statistical method of the virtual model. If the portion beyond the solid line represents an outlier portion, the level of confidence will be lower. FIG. 9 shows a predictive result of a virtual metrology model, and the portion of the solid line is formed by the actually measured points, and a bold asterisk represents the last record of values used for predicting the original data by the virtual model, and the circle represents a point with a difference exceeding three standard deviations between the value predicted by the virtual model and the actual measured point, and the light asterisk represents our primary goal, which is a value of a virtual metrology point of the virtual model, and the performance index of a fault is a mean square error (MSE) as shown below:

$$MSE = \frac{1}{n}\sum_{i=1}^{n}(y_i - \hat{y}_i)^2$$

The result of using the stepwise regression scheme to select variable is relatively good, and the MSE of the average virtual model is 252, and the average predictive quality is 96.3%, and the adjusted actual quality is 95.1%.

Figure 10:
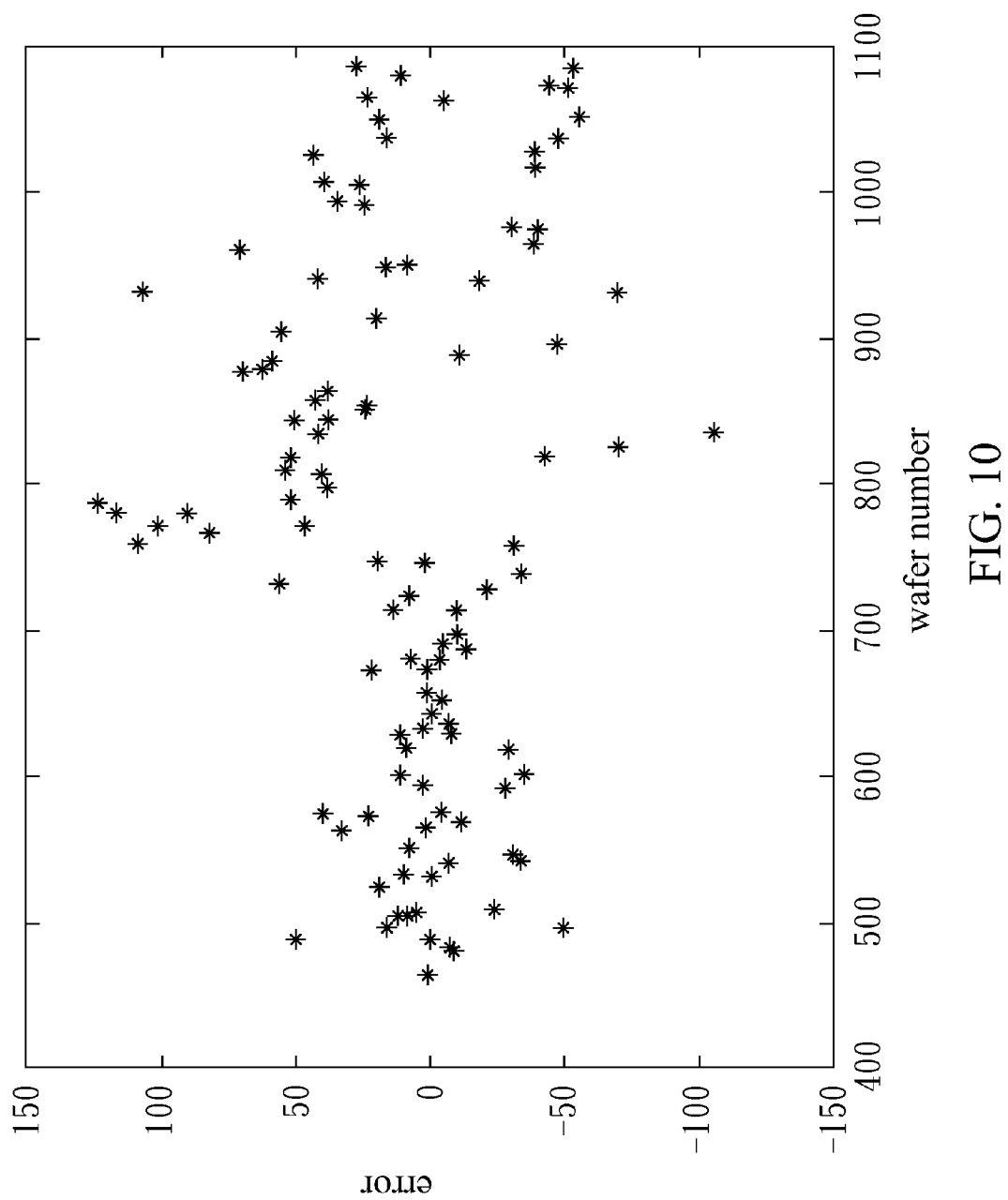
FIG. 10 is a diagram showing an actual error analysis of a process quality prediction method according to a preferred embodiment of the present invention.
Figure 11:
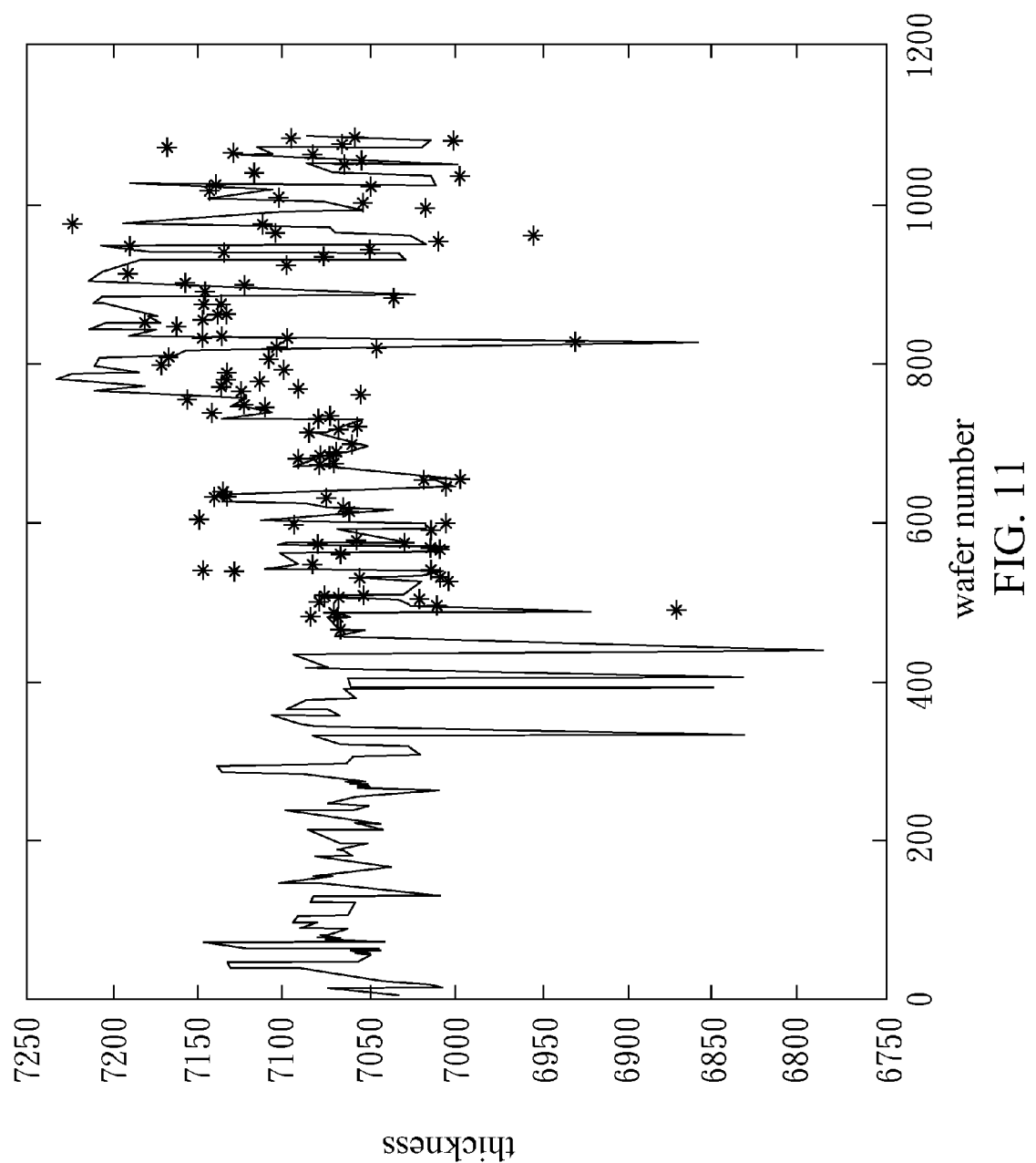
FIG. 11 is a comparison diagram for comparing an actual measured value with a virtual model in a process quality prediction method according to a preferred embodiment of the present invention.

Referring to FIGS. 10 and 11, there are shown a diagram showing an actual error analysis of a process quality prediction method and a comparison diagram for comparing an actual measured value with a virtual model in a process quality prediction method according to a preferred embodiment of the present invention. The asterisk shown in FIG. 10 shows the diagram drawn according to the difference of the predictive value of the predictive quality and the actual measured value, and the asterisk shown in FIG. 11 shows a position where the value of the predictive quality of the virtual model is located, and the MSE of the predicted result is 41.65.

The above description is illustrative only and is not to be considered limiting. Various modifications or changes can be made without departing from the spirit and scope of the invention. All such equivalent modifications and changes shall be included within the scope of the appended claims.

What is claimed is:

1. A process quality prediction system comprising:
a processing apparatus arranged for performing a process on at least one batch product;
a measurement apparatus arranged for sampling and inspecting the at least one batch product to obtain an actual measured value of the batch product;
a fault detection and classification unit electrically connected to the processing apparatus for recording the process to obtain a process value;
a data collection unit connected to the fault detection and classification unit and the measurement apparatus for obtaining the process value via the fault detection and classification unit and obtaining the actual measured value of the batch product from the measurement apparatus; and
a virtual metrology automation unit arranged for establishing a virtual metrology model based on the process value and the actual measured value of the batch product, and predicting a quality value of the product being processed inline according to the virtual metrology model in real-time;
wherein the batch product is a wafer or a substrate;
wherein the virtual metrology automation unit filters out the process-independent data from the process value and the actual measured value of the batch product to fetch a process characteristic value set;
wherein the virtual metrology automation unit uses the process characteristic value set to update a moving window module and thus obtain a key variable set affecting the process.

2. The process quality prediction system of claim 1, wherein the virtual metrology automation unit uses an analysis of covariance to analyze the key variable set and thus obtain the virtual metrology model.

3. The process quality prediction system of claim 2, wherein the moving window module is used for showing all the data of the at least one batch product in the process during a recent period of time.

4. The process quality prediction system of claim 2, wherein a stepwise regression scheme is selectively used to obtain variables affecting the process from the key variable set.

5. A process quality prediction method comprising:
performing a process on at least one batch product in a processing apparatus;
sampling and inspecting the at least one batch product by a measurement apparatus;
obtaining a process value through a fault detection and classification unit by a data collection unit and obtaining an actual measured value of the batch product through the measurement apparatus by the data collection unit;
obtaining a virtual metrology model from the process value and the actual measured value of the batch product by a virtual metrology automation unit; and
predicting the quality value of the product being processed inline according to the virtual metrology model in real-time;
wherein the batch product is a wafer or a substrate;

wherein the virtual metrology automation unit filters out the process-independent data from the process value and the actual measured value of the batch product to fetch a process characteristic value set;

wherein the virtual metrology automation unit uses the process characteristic value set to update a moving window module and thus obtain a key variable set affecting the process.

6. The process quality prediction method of claim 5, wherein the virtual metrology automation unit uses an analysis of covariance to analyze the key variable set and thus obtain the virtual metrology model.

7. The process quality prediction method of claim 5, wherein the moving window module is used for showing all the data of the at least one batch product in the process during a recent period of time.

8. The process quality prediction method of claim 5, wherein a stepwise regression scheme is selectively used to obtain variables affecting the process from the key variable set.

* * * * *